United States Patent
Noda et al.

(10) Patent No.: US 6,432,802 B1
(45) Date of Patent: Aug. 13, 2002

(54) METHOD FOR FABRICATING SEMICONDUCTOR DEVICE

(75) Inventors: Taiji Noda, Osaka; Hiroyuki Umimoto, Hyogo; Shinji Odanaka, Osaka, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/662,359

(22) Filed: Sep. 15, 2000

(30) Foreign Application Priority Data

Sep. 17, 1999 (JP) .............................. 11-264136

(51) Int. Cl.$^7$ ......................................... H01L 21/3205
(52) U.S. Cl. ...................... 438/585; 438/595; 438/305; 438/302
(58) Field of Search ................................ 438/585, 595, 438/561, 307, 302, 305

(56) References Cited

U.S. PATENT DOCUMENTS

| | | | | |
|---|---|---|---|---|
| 4,198,250 A | * | 4/1980 | Jecmen | 148/1.5 |
| 4,434,013 A | * | 2/1984 | Bol | 148/1.5 |
| 4,728,617 A | * | 3/1988 | Woo et al. | 437/30 |
| 5,648,287 A | * | 7/1997 | Tsai et al. | 438/305 |
| 5,753,556 A | * | 5/1998 | Katada et al. | 438/302 |
| 6,037,640 A | * | 3/2000 | Lee | 257/408 |
| 6,080,630 A | * | 6/2000 | Milic-strakalj | 438/305 |
| 6,096,586 A | * | 8/2000 | Milic-strakalj | 438/174 |
| 6,156,615 A | * | 12/2000 | Kepler | 438/305 |
| 6,207,482 B1 | * | 3/2001 | Shih et al. | 438/199 |

* cited by examiner

Primary Examiner—Hoai Ho
Assistant Examiner—Thao P Le
(74) Attorney, Agent, or Firm—Nixon Peabody LLP; Donald R. Studebaker

(57) ABSTRACT

After a gate electrode has been formed over a semiconductor region with a gate insulating film interposed therebetween, an amorphous layer is formed in the semiconductor region by implanting heavy ions with a large mass into the semiconductor region using the gate electrode as a mask. Then, ions of a first dopant are implanted into the semiconductor region using the gate electrode as a mask. Next, a first annealing process is conducted on the semiconductor region at a temperature between 400° C. and 550° C., thereby making the amorphous layer recover into a crystalline layer. Subsequently, a second annealing process is conducted on the semiconductor region, thereby forming an extended high-concentration dopant diffused layer of a first conductivity type and a pocket dopant diffused layer of a second conductivity type. The extended high-concentration dopant diffused layer is formed to have a shallow junction by diffusing the first dopant, while the pocket dopant diffused layer is formed under the extended high-concentration dopant diffused layer by diffusing the heavy ions.

19 Claims, 12 Drawing Sheets

METHOD FOR FABRICATING SEMICONDUCTOR DEVICE

BACKGROUND OF THE INVENTION

The present invention relates to a method for fabricating an MIS semiconductor device that has a superfine structure contributing to ultralarge-scale integration of a semiconductor integrated circuit and that can operate at a high speed with its power dissipation reduced.

As ultralarge-scale integration of semiconductor integrated circuits advances, miniaturization of MIS transistors is demanded more and more strongly. For that purpose, an MIS transistor with a shallow junction is now in high demand.

FIG. 10 illustrates a cross-sectional structure for a known MIS transistor with a shallow junction. A gate electrode 3 has been formed over a p-type semiconductor substrate 1 with a gate insulating film 2 interposed therebetween. In respective surface regions of the semiconductor substrate 1 that are located on both sides of the gate electrode 3 (i.e., regions to be source/drain regions), high-concentration dopant diffused layer 5, extended high-concentration dopant diffused layer 6 and pocket dopant diffused layer 7 have been formed. The high-concentration dopant diffused layer 5 is formed to have a deep junction by diffusing an n-type dopant (e.g., arsenic) thereto. The extended high-concentration dopant diffused layer 6 is formed inside the high-concentration dopant diffused layer 5 by diffusing an n-type dopant (e.g., arsenic) thereto and has a junction shallower than that of the high-concentration dopant diffused layer 5. And the pocket dopant diffused layer 7 is located under the extended high-concentration dopant diffused layer 6 and has been formed by diffusing a p-type dopant (e.g., boron) thereto. Also, a sidewall 8 has been formed out of an insulating film on the side faces of the gate electrode 3.

Hereinafter, a method for fabricating the known MIS transistor will be described with reference to FIGS. 11(a) through 11(e).

First, as shown in FIG. 11(a), a gate electrode 3 of polysilicon is formed over a p-type semiconductor substrate 1 with a gate insulating film 2 interposed therebetween.

Next, ions of arsenic and boron, which are n- and p-type dopants, respectively, are implanted in this order using the gate electrode 3 as a mask, thereby forming an n-type high-concentration dopant layer 6A and a p-type-ion implanted layer 7A, respectively, as shown in FIG. 11(b).

Then, a silicon nitride film is deposited over the entire surface of the semiconductor substrate 1 at a temperature of about 700° C., and then etched anisotropically, thereby forming a sidewall 8 on the side faces of the gate electrode 3 as shown in FIG. 11(c).

Subsequently, ions of arsenic as an n-type dopant are implanted using the gate electrode 2 and sidewall 8 as a mask. Then, annealing is conducted at a temperature between about 900° C. and about 1000° C. for about 10 seconds. In this manner, n-type high-concentration dopant diffused layer 5 with a deep junction, n-type extended high-concentration dopant diffused layer 6 located inside the high-concentration dopant diffused layer 5 and having a junction shallower than that of the high-concentration dopant diffused layer 5 and p-type pocket dopant diffused layer 7 located under the extended high-concentration dopant diffused layer 6 are formed as shown in FIG. 11(d).

Thereafter, a cobalt film and a titanium nitride film are deposited in this order to thicknesses of about 10 nm and about 20 nm, respectively, over the semiconductor substrate 1 by a sputtering process. Next, annealing is conducted at a temperature of about 550° C. for about 10 seconds. Then, the titanium nitride film and unreacted parts of the cobalt film are selectively etched away using a mixture of sulfuric acid, hydrogen peroxide and water. And then annealing is conducted at a temperature of about 800° C. for about 10 seconds. In this manner, a cobalt silicide layer 9 is formed to a thickness of about 30 nm on respective surfaces of the gate electrode 3 and high-concentration dopant diffused layer 5 in a self-aligned manner as shown in FIG. 11(e).

In the known MIS transistor fabrication process, the implant energy of arsenic ions for the n-type-ion implanted layer 6A to be the extended high-concentration dopant diffused layer 6 is lowered to make the junction of the extended high-concentration dopant diffused layer 6 shallower and thereby increase the driving power of the MIS transistor. Also, to reduce the parasitic resistance of the source/drain regions, the implant dose of the arsenic ions is normally increased in this case.

However, if the n-type-ion implanted layer 6A is formed by implanting the arsenic ions at a high implant dose and with a low implant energy, then transient enhanced diffusion (TED) of arsenic (i.e., dopant for the n-type-ion implanted layer 6A) occurs as a result of the low-temperature (e.g., about 700° C.) annealing process to be carried out to form the sidewall 8. In that case, the extended high-concentration dopant diffused layer 6 cannot be formed to have a shallow junction as designed. As used herein, the transient enhanced diffusion is a phenomenon in which an introduced dopant unintentionally diffuses at such a rate as exceeding its diffusion coefficient in thermal equilibrium state. This is because point defects, existing in excessive numbers between lattice sites, and the dopant interact with each other to mutually enhance their diffusion.

FIG. 12 illustrates profiles of the dopants, which have been introduced to form the extended high-concentration dopant diffused layer 6 and pocket dopant diffused layer 7, in the depth direction (i.e., the direction indicated by the line A–A' in FIG. 10). As can be seen from FIG. 12, the profile of arsenic for the extended high-concentration dopant diffused layer 6 as plotted in the depth direction shows that its diffusion is rather deep due to the transient enhanced diffusion effects during the anneal. Boron for the pocket dopant diffused layer 7 has also been much affected by the transient enhanced diffusion so that its profile has lost steepness. As also can be seen from FIG. 12, according to the known method, it is difficult to form the extended high-concentration dopant diffused layer 6 and pocket dopant diffused layer 7 just as intended, i.e., so that these layers are shallow and steep enough and exhibit excellent short channel effects.

SUMMARY OF THE INVENTION

In view of the foregoing, an object of the present invention is providing a method for fabricating a semiconductor device that can shallow the junction depth of the extended high-concentration dopant diffused layer and can minimize increase in leakage current.

To achieve this object, a first inventive method for fabricating a semiconductor device includes the steps of: forming a gate electrode over a semiconductor region with a gate insulating film interposed therebetween; forming an amorphous layer in the semiconductor region by implanting heavy ions with a large mass into the semiconductor region using the gate electrode as a mask; implanting ions of a first dopant into the semiconductor region using the gate electrode as a mask; conducting a first annealing process on the semiconductor region at a temperature between 400° C. and 550° C., thereby making the amorphous layer recover into a crystalline layer; and conducting a second annealing process on the semiconductor region, thereby forming an extended high-concentration dopant diffused layer of a first conductivity type and a pocket dopant diffused layer of a second conductivity type. The extended high-concentration dopant diffused layer is formed to have a shallow junction by diffusing the first dopant, while the pocket dopant diffused layer is formed under the extended high-concentration dopant diffused layer by diffusing the heavy ions.

In the first method for fabricating a semiconductor device, after an amorphous layer has been formed in a semiconductor region by implanting heavy ions with a large mass that will make a pocket dopant diffused layer, ions of a first dopant are implanted. Accordingly, channeling of the first dopant is avoidable and therefore the extended high-concentration dopant diffused layer can have a shallower junction. As a result, a transistor can be downsized without decreasing the driving power thereof.

Also, after the heavy ions and ions of a first dopant, which will make the pocket dopant diffused layer and extended high-concentration dopant diffused layer, respectively, have been implanted, an annealing process is conducted at a temperature between 400° C. and 550° C., thereby recovering the crystallinity of the semiconductor region. And then the extended high-concentration dopant diffused layer and pocket dopant diffused layer are formed by activating the first dopant and heavy ions. Accordingly, no amorphous/crystalline interface or no dislocation loop layer is formed in the extended high-concentration dopant diffused layer and pocket dopant diffused fused layer. Thus, it is possible to avoid a situation where dopant atoms are trapped and segregate in the dislocation loop layer. As a result, leakage current, caused by the dislocation loop layer, can be reduced.

A second inventive method for fabricating a semiconductor device includes the steps of: forming a gate electrode over a semiconductor region with a gate insulating film interposed therebetween; repeatedly performing, a number of times, the steps of implanting, using the gate electrode as a mask, heavy ions with a large mass into the semiconductor region at such an implant dose as forming no amorphous layers and conducting a first annealing process on the semiconductor region at an elevated temperature for a short period of time; implanting ions of a first dopant into the semiconductor region using the gate electrode as a mask; and conducting a second annealing process on the semiconductor region, thereby forming an extended high-concentration dopant diffused layer of a first conductivity type and a pocket dopant diffused layer of a second conductivity type. The extended high-concentration dopant diffused layer is formed to have a shallow junction by diffusing the first dopant, while the pocket dopant diffused layer is formed under the extended high-concentration dopant diffused layer by diffusing the heavy ions.

In the second method for fabricating a semiconductor device, heavy ions with a large mass, which will make a pocket dopant diffused layer, are repeatedly implanted a number of times at such an implant dose as forming no amorphous layers each time. Thus, no amorphous layers are formed in the semiconductor region and therefore no amorphous/crystalline interface or no dislocation loop layer will be formed, either. Thus, it is possible to avoid a situation where dopant atoms are trapped and segregate in the dislocation loop layer. As a result, leakage current, caused by the dislocation loop layer, can be reduced. Since no dislocation loop layer is formed, leakage current decreases. Consequently, a semiconductor device can be fabricated using the heavy ions so as to have a shallower junction depth and a reduced junction leakage current.

Although the implant dose is set relatively low for each implantation process of the heavy ions, the heavy ions are implanted several times. Thus, the dopant concentration of the pocket dopant diffused layer will not be lower than expected.

Furthermore, every time the heavy ions are implanted, a rapid thermal annealing process is conducted at an elevated temperature for just a short period of time. Thus, the damage done on the crystals in the semiconductor region due to the heavy ion implantation does not accumulate but can be repaired each time. Accordingly, the leakage current can be further reduced.

A third inventive method for fabricating a semiconductor device includes the steps of: forming a gate electrode over a semiconductor region with a gate insulating film interposed therebetween; forming an amorphous layer in the semiconductor region by implanting heavy ions with a large mass into the semiconductor region using the gate electrode as a mask; implanting ions of a first dopant into the semiconductor region using the gate electrode as a mask; implanting ions of a Group IV element into the semiconductor region using the gate electrode as a mask, thereby lowering the amorphous layer to a deeper level in a substrate; and conducting a second annealing process on the semiconductor region, thereby forming an extended high-concentration dopant diffused layer of a first conductivity type and a pocket dopant diffused layer of a second conductivity type. The extended high-concentration dopant diffused layer is formed to have a shallow junction by diffusing the first dopant, while the pocket dopant diffused layer is formed under the extended high-concentration dopant diffused layer by diffusing the heavy ions.

In the third method for fabricating a semiconductor device, after an amorphous layer has been formed in a semiconductor region by implanting heavy ions with a large mass that will make a pocket dopant diffused layer, ions of a first dopant are implanted. Accordingly, channeling of the first dopant is avoidable and therefore the extended high-concentration dopant diffused layer can have a shallower junction. As a result, a transistor can be downsized without decreasing the driving power thereof.

Also, after the heavy ions and ions of the first dopant, which will make the pocket dopant diffused layer and extended high-concentration dopant diffused layer, respectively, have been implanted, ions of a Group IV element are implanted to lower the level of the amorphous layer deeper into the substrate. And then the extended high-concentration dopant diffused layer and pocket dopant diffused layer are formed by activating the first dopant and heavy ions. Accordingly, no amorphous/crystalline interface or no dislocation loop layer is formed in the extended high-concentration dopant diffused layer and pocket dopant diffused layer. Thus, it is possible to avoid a situation where dopant ions segregate in the dislocation loop layer. As a result, leakage current can be reduced.

Furthermore, after the amorphous layer has been lowered to a deeper level in the substrate, the extended high-concentration dopant diffused layer and pocket dopant diffused layer are formed. Thus, annealing can be performed with the amorphous/crystalline interface moved to a level far away from a region that will affect the transistor electrically.

For that reason, even if the rapid thermal annealing is carried out while the amorphous/crystalline interface exists, the dislocation loop layer will be formed at a level much distant from the vicinity of the junction. Accordingly, the leakage current is suppressible.

Moreover, since the dislocation loop layer is also located at a level far away from the high-concentration region of the heavy ions, it is possible to suppress the heavy ions from being deposited in the dislocation loop layer.

A fourth inventive method for fabricating a semiconductor device includes the steps of: forming a gate electrode over a semiconductor region with a gate insulating film interposed therebetween; forming an extended high-concentration dopant diffused layer of a first conductivity type through diffusion of heavy ions with a large mass by repeatedly performing, a number of times, the steps of implanting, using the gate electrode as a mask, the heavy ions into the semiconductor region at such an implant dose as forming no amorphous layers and conducting an annealing process on the semiconductor region at an elevated temperature for a short period of time; forming a sidewall on side faces of the gate electrode and then implanting ions of a dopant into the semiconductor region using the gate electrode and the sidewall as a mask; and activating and diffusing the dopant, thereby forming a high-concentration dopant diffused layer of the first conductivity type, which is located outside of the extended high-concentration dopant diffused layer and has a deep junction.

In the fourth method for fabricating a semiconductor device, heavy ions with a large mass, which will make an extended high-concentration dopant diffused layer, are implanted at such an implant dose as forming no amorphous layers. Accordingly, no amorphous layers will be formed in the semiconductor region, and no amorphous/crystalline interface or no dislocation loop layer will be formed, either. Thus, it is possible to avoid a situation where heavy ions segregate in the dislocation loop layer. As a result, leakage current can be reduced. Since no dislocation loop layer is formed, leakage current decreases. Consequently, a semiconductor device can be fabricated using the heavy ions so as to have a shallower junction depth and a reduced junction leakage current.

Although the implant dose is set relatively low for each heavy ion implantation process, the heavy ions are implanted several times. Thus, the dopant concentration of the pocket dopant diffused layer will not be lower than expected.

Furthermore, every time the heavy ions are implanted, a rapid thermal annealing process is conducted at an elevated temperature for just a short period of time. Thus, the damage done on the crystals in the semiconductor region due to the heavy ion implantation does not accumulate but can be repaired each time. Accordingly, the leakage current can be further reduced.

BRIEF DESCRIPTION OF THE DRAWINGS

FIGS. 11(a) through 1(e) are cross-sectional views illustrating respective process steps for fabricating the known MIS transistor.

DESCRIPTION OF THE PREFERRED EMBODIMENTS

EMBODIMENT 1

Hereinafter, a method for fabricating an MIS transistor according to a first embodiment of the present invention will be described with reference to FIGS. 1(a) through 1(c) and FIGS. 2(a) through 2(c).

Figure 1A:
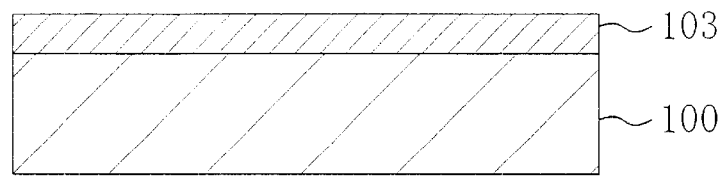
FIGS. 1(a) through 1(c) are cross-sectional views illustrating respective process steps for fabricating an MIS transistor according to a first embodiment of the present invention.

First, as shown in FIG. 1(a), ions of a p-type dopant (e.g., indium ions) are implanted into a semiconductor substrate 100 of p-type silicon at an implant energy of 200 keV and at an implant dose of about $1 \times 10^{12}/cm^2$. Just after this ion implantation, a first annealing process (i.e., rapid thermal annealing (RTA)) is conducted. Specifically, the semiconductor substrate 100 is heated up to an elevated temperature between 950° C. and 1050° C. at a rate of 100° C. per second and then kept at the temperature for a short period of time between about 1 second and about 10 seconds. In this manner, a p-type dopant diffused layer 103, which will be a channel region, is formed in a surface region of the semiconductor substrate 100.

Figure 1B:
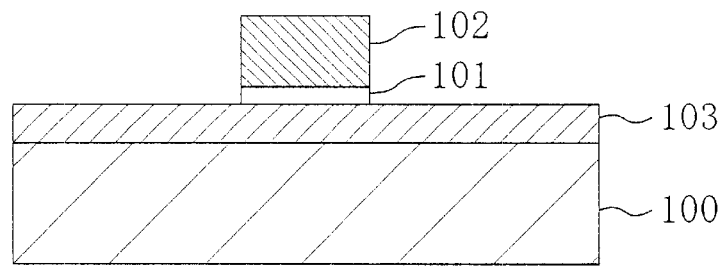

Next, as shown in FIG. 1(b), a gate electrode 102 (thickness: about 250 nm) of polysilicon film or poly-metal is formed over the semiconductor substrate 100 with a gate insulating film 101 (thickness: about 2.5 nm) interposed therebetween.

Subsequently, ions of a p-type dopant (e.g., indium ions) are implanted into the semiconductor substrate 100 at an implant energy of 15 keV and at an implant dose of about $1 \times 10^{14}/cm^2_2$ for example, using the gate electrode 102 as a mask. The indium ions are implanted to form a pocket dopant layer. However, when heavy ions with a large mass like indium ions are implanted, an amorphous layer is formed in the semiconductor substrate 100. Thereafter, ions of an n-type dopant (e.g., arsenic ions) are implanted at an implant energy of 10 kev and at an implant dose of about $5 \times 10^{14}/cm^2$. The arsenic ions are implanted to form an extended high-concentration dopant layer.

Figure 1C:
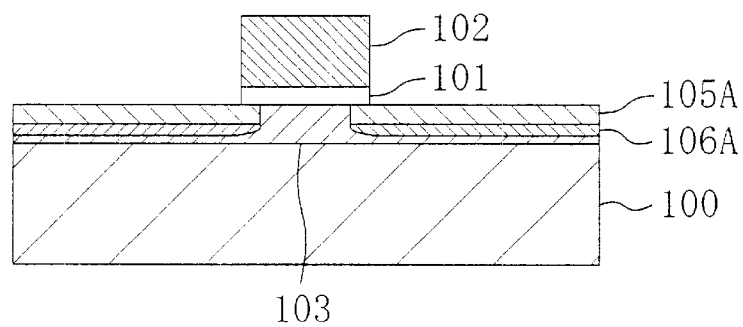

In this manner, as shown in FIG. 1(c), an n-type extended high-concentration dopant layer 105A with a shallow junction is formed in respective regions of the semiconductor substrate 100 to be source/drain regions by doping the arsenic ions thereto. In addition, a p-type pocket dopant layer 106A is also formed under the extended high-concentration dopant layer 105A by doping the indium ions. It should be noted that the extended high-concentration dopant layer 105A and pocket dopant layer 106A are labeled as such (i.e., not as dopant diffused layers) because these dopant layers have not been annealed yet.

Figure 2A:
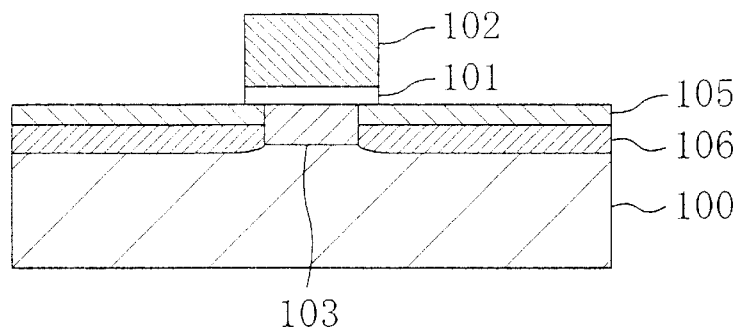
FIGS. 2(a) through 2(c) are cross-sectional views illustrating respective process steps for fabricating the MIS transistor of the first embodiment of the present invention.

Next, a second annealing process is conducted at a very low temperature between 400° C. and 550° C. on the semiconductor substrate 100, thereby changing the amorphous layer, existing in the semiconductor substrate 100, into a crystalline layer (i.e., recovering the crystallinity of the semiconductor substrate 100). Thereafter, a third annealing process (i.e., RTA) is conducted. Specifically, the semiconductor substrate 100 is heated up to an elevated temperature between 950° C. and 1050° C. at a rate of about 100° C. per second and then kept at the temperature for a short period of time between about 1 second and about 10 seconds. In this manner, as shown in FIG. 2(a), an n-type extended high-concentration dopant diffused layer 105 (defined by annealing the extended high-concentration dopant layer 105A) with a shallow junction is formed in respective regions of the semiconductor substrate 100 to be source/drain regions by diffusing the arsenic ions thereto. In addition, a p-type pocket dopant diffused layer 106 (defined by annealing the pocket dopant layer 106A) is also formed under the extended high-concentration dopant diffused layer 105 by diffusing the indium ions.

Figure 2B:
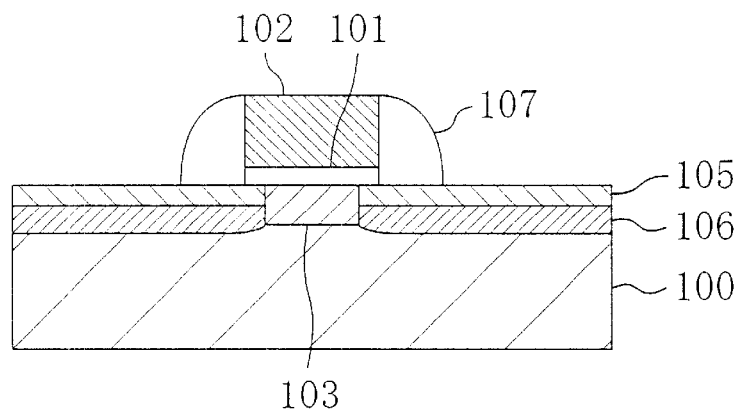
Figure 2C:
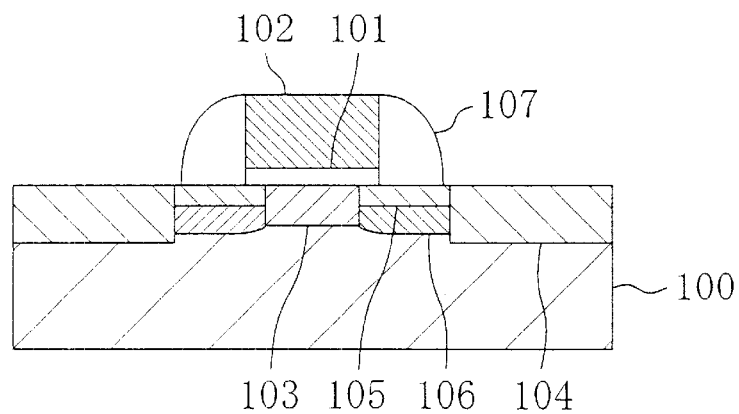

Then, a silicon nitride film is deposited to a thickness of 50 nm, for example, over the entire surface of the semiconductor substrate 100 and then etched anisotropically, thereby forming a sidewall 107 on the side faces of the gate electrode 102 as shown in FIG. 2(b). It should be noted that the sidewall 107 may be formed out of a silicon dioxide film, not the silicon nitride film.

Next, ions of an n-type dopant (e.g., arsenic ions) are implanted into the semiconductor substrate 100 at an implant energy of 30 kev and at an implant dose of about $3 \times 10^{15}/cm^2$ using the gate electrode 102 and sidewall 107 as a mask. Subsequently, a fourth annealing process (i.e., RTA) is conducted. Specifically, the semiconductor substrate 100 is heated up to an elevated temperature between 950° C. and 1050° C. at a rate between 100° C. per second and 150° C. per second and then kept at the temperature for a short period of time between about 1 second and about 10 seconds. In this manner, an n-type high-concentration dopant diffused layer 104 with a deep junction is formed in the source/drain regions of the semiconductor substrate 100 by diffusing the arsenic ions.

According to the first embodiment, after the amorphous layer has been formed in the semiconductor substrate 100 by implanting indium ions at an implant dose of about $1 \times 10^{14}/cm^2$ to make the pocket dopant diffused layer 106, arsenic ions are implanted. Accordingly, it is possible to avoid a situation where the arsenic ions reach a considerably deep level in the substrate through channeling.

Also, according to the first embodiment, indium ions, which are exemplary heavy ions with a large mass number, are used to form the pocket dopant diffused layer 106. In addition, the ion implantation process for forming the pocket dopant diffused layer 106 is carried out before the ion implantation process for forming the extended high-concentration dopant diffused layer 105. Accordingly, the ion implantation process for forming the pocket dopant diffused layer 106 brings about the additional effect of pre-amorphizing the semiconductor substrate 100 (which will be herein called "preamorphization effect"). That is to say, there is no need to separately perform an ion implantation process for the very purposes of pre-amorphization and prevention of channeling.

Moreover, thanks to the pre-amorphization effect produced by the implantation of the heavy ions, the extended high-concentration dopant layer 105A (or the extended high-concentration dopant diffused layer 105 eventually) can have a shallower junction.

A minimum required implant dose, at and over which the amorphous layer can be formed by implanting the indium ions, is $5 \times 10^{13}/cm^2$. Thus, by implanting the indium ions at least at this implant dose, the process step of implanting ions to form the pocket dopant diffused layer 106 and the process step of forming the amorphous layer can be combined into a single process step.

Furthermore, after the indium and arsenic ions have been implanted, the second annealing process is conducted at a very low temperature, thereby recovering the crystallinity of the semiconductor substrate 100. And then the third annealing process (RTA) is carried out to form the extended high-concentration dopant diffused layer 105 and pocket dopant diffused layer 106. Thus, a dislocation loop layer, which would otherwise be created below the amorphous/crystalline interface that has come to exist immediately after the ions were implanted to form the pocket dopant layer 106A, can be substantially eliminated. Since almost no dislocation loop layer exists, it is possible to prevent dopant atoms from being trapped and segregated in the dislocation loop layer. Moreover, since the creation of the dislocation loop layer is almost avoidable, junction leakage current, resulting from the dislocation loop, is suppressible. As a result, a semiconductor device with a shallow junction depth and much reduced junction leakage current can be fabricated.

Furthermore, after the very-low-temperature anneal is over, the third annealing process is performed at an elevated temperature for just a short period of time to define the extended high-concentration dopant diffused layer 105 and pocket dopant diffused layer 106. As a result, the dopants, which have not yet been activated enough through the very-low-temperature anneal, can be activated sufficiently. In this case, the rapid thermal annealing is performed at an elevated temperature to suppress the transient enhanced diffusion of the dopant ions, keep the junction depth shallow enough and increase the degree of activation. However, if this rapid thermal annealing at the elevated temperature is performed just after the indium ions have been implanted at the high dose, the creation of the dislocation loop layer is adversely promoted and the segregation of indium on the dislocation loop layer is accelerated unintentionally. Thus, according to the first embodiment, it is not until the very-low-temperature anneal has been performed as the second annealing process that the rapid thermal annealing at the elevated temperature is conducted as the third annealing process. In this manner, the diffused layer of indium or any other dopant can be activated sufficiently with the creation of the dislocation loop layer and the segregation of indium on the dislocation loop layer both suppressed.

Moreover, the p-type dopant diffused layer 103 to be a channel region is formed by implanting indium ions (i.e., exemplary heavy ions with a large mass) into the semiconductor substrate 100. Thus, the dopant concentration is relatively low in the uppermost part of the channel region that is closest to the surface of the substrate. Accordingly, the carrier mobility will not decrease in that part and yet a steep dopant concentration can be obtained in another part of the channel region that is slightly deeper than the surface of the substrate. As a result, the transistor can be downsized without decreasing the driving power thereof.

Furthermore, immediately after the ions of indium with a large mass have been implanted, the annealing process (RTA) is performed to form the p-type dopant diffused layer 103. Thus, the damage done on the crystals in the semiconductor substrate 100 through the indium ion implantation can be repaired quickly.

In the first embodiment, indium ions are implanted for the p-type dopant diffused layer 103 to be a channel region. Alternatively, either boron ions or boron and indium ions may be implanted instead.

Also, indium ions are used to form the pocket dopant diffused layer 106. Optionally, ions of another element, belonging to the same Group 3B as indium but having a mass number greater than that of indium, may also be used.

Furthermore, the third annealing process (i.e., the process step shown in FIG. 2(a)) may be omitted. In that case, by conducting the fourth annealing process (i.e., the process step shown in FIG. 2(c)), the n-type extended high-concentration dopant diffused layer 105, p-type pocket dopant diffused layer 106 and high-concentration dopant diffused layer 104 can be formed at a time.

Moreover, the first embodiment is an n-channel MIS transistor. Alternatively, a p-channel MIS transistor is also implementable. In fabricating a p-channel MIS transistor, either antimony ions or ions of any other Group 5B element with a mass number greater than that of antimony (e.g., bismuth ions) may be implanted as dopant ions for the pocket dopant diffused layer 106.

EMBODIMENT 2

Hereinafter, a method for fabricating an MIS transistor according to a second embodiment of the present invention will be described with reference to FIGS. 3(a) through 3(c) and FIGS. 4(a) through 4(c).

Figure 3A:
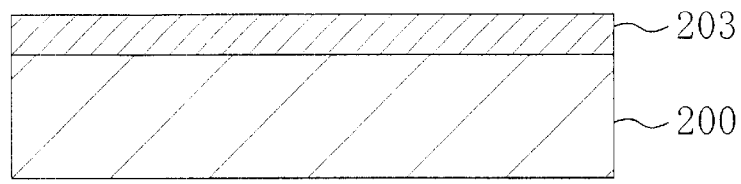
FIGS. 3(a) through 3(c) are cross-sectional views illustrating respective process steps for fabricating an MIS transistor according to a second embodiment of the present invention.

First, as shown in FIG. 3(a), ions of a p-type dopant (e.g., indium ions) are implanted into a p-type semiconductor substrate 200 at an implant energy of 200 keV and at an implant dose of about $1 \times 10^2/cm^2$. Just after this ion implantation, a first annealing process (i.e., RTA) is conducted. Specifically, the semiconductor substrate 200 is heated up to an elevated temperature between 950° C. and 1050° C. at a rate of 100° C. per second and then kept at the temperature for a short period of time between about 1 second and about 10 seconds. In this manner, a p-type dopant diffused layer 203, which will be a channel region, is formed in a surface region of the semiconductor substrate 200.

Figure 3B:
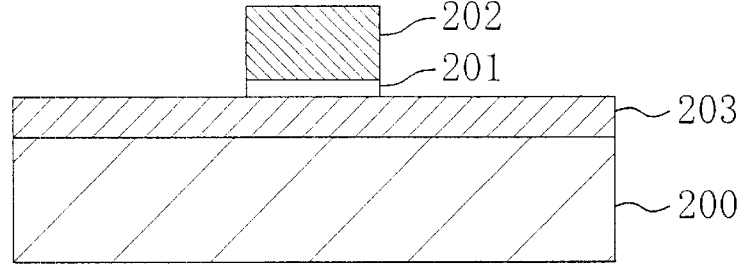
Figure 3C:
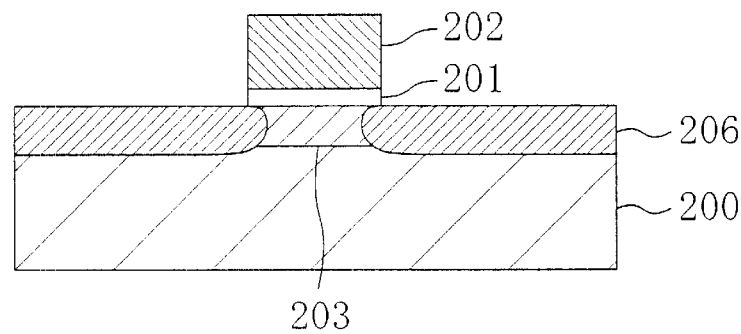

Next, as shown in FIG. 3(b), a gate electrode 202 (thickness: about 250 nm) of polysilicon film or poly-metal is formed over the semiconductor substrate 200 with a gate insulating film 201 (thickness: about 2.5 nm) interposed therebetween Subsequently, ions of a p-type dopant (e.g., indium ions) are implanted into the semiconductor substrate 200 at an implant energy of 15 keV and at an implant dose of $1 \times 10^{13}/cm^2$ or less using the gate electrode 202 as a mask. Thereafter, a second annealing process (i.e., RTA) is conducted. Specifically, the semiconductor substrate 200 is heated up to an elevated temperature between 950° C. and 1050° C. at a rate of 100° C. per second and then kept at the temperature for a short period of time between about 1 second and about 10 seconds. By repeatedly performing these ion implantation and annealing process steps eight times in total, for example, a pocket dopant diffused layer 206 is formed in respective surface regions of the semiconductor substrate 200 (i.e., source/drain regions) by diffusing the indium ions as shown in FIG. 3(c) should be noted that the number of times the ion implantation and annealing process steps are repeated does not have to be eight. However, to attain a predetermined dopant concentration in the end, the indium ions should be implanted several times at a divided implant dose, which is low enough to prevent any amorphous layer from being created as a result of the indium ion implantation. Also, just after the ions have been implanted each time, the annealing needs to be conducted at an elevated temperature for a short period of time. It should be noted that the annealing processes to be conducted multiple times (e.g., eight times in total) are herein collectively called the "second annealing process" for convenience sake.

Figure 4A:
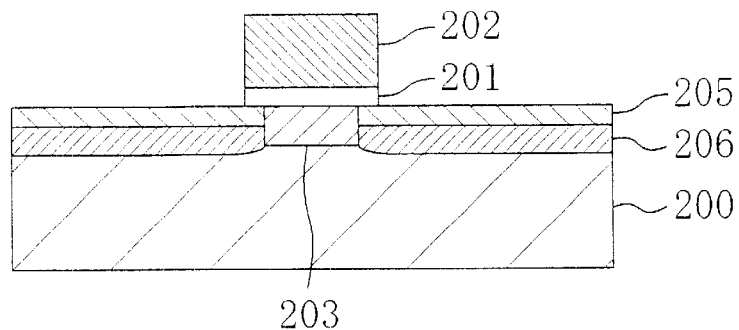
FIGS. 4(a) through 4(c) are cross-sectional views illustrating respective process steps for fabricating the MIS transistor of the second embodiment of the present invention.

Next, ions of an n-type dopant (e.g., arsenic ions) are implanted into the semiconductor substrate 200 at an implant energy of 10 keV and at an implant dose of about $5 \times 10^{14}/cm^2$ using the gate electrode 202 as a mask. Thereafter, a third annealing process (i.e., RTA) is conducted. Specifically, the semiconductor substrate 200 is heated up to an elevated temperature between 950° C. and 1050° C. at a rate of 100° C. per second and then kept at the temperature for a short period of time between about 1 second and about 10 seconds. In this manner, an extended high-concentration dopant diffused layer 205 with a shallow junction is formed in the surface region of the pocket dopant diffused layer 206 by diffusing the arsenic ions as shown in FIG. 4(a).

Figure 4B:
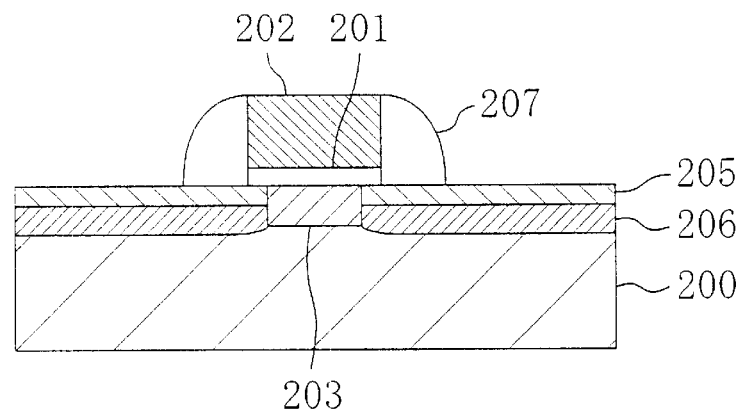
Figure 4C:
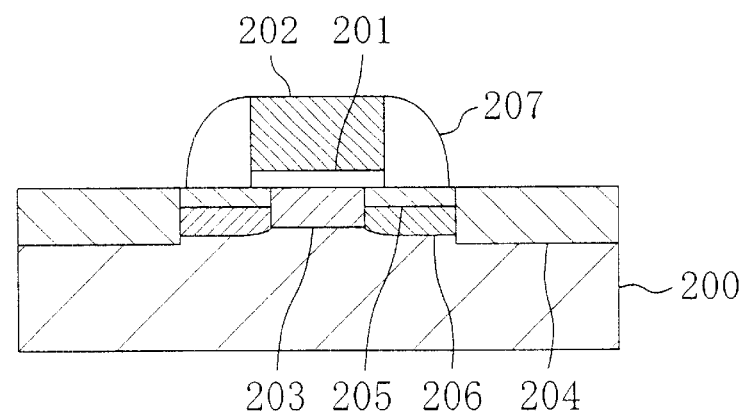

Then, a silicon nitride film is deposited to a thickness of 50 nm, for example, over the entire surface of the semiconductor substrate 200 and then etched anisotropically, thereby forming a sidewall 207 on the side faces of the gate electrode 202 as shown in FIG. 4(b). It should be noted that the sidewall 207 may be formed out of a silicon dioxide film, not the silicon nitride film.

Next, ions of an n-type dopant (e.g., arsenic ions) are implanted into the semiconductor substrate 200 at an implant energy of 30 keV and at an implant dose of about $3 \times 10^{15}/cm^2$ using the gate electrode 202 and sidewall 207 as a mask. Subsequently, a fourth annealing process (i.e., RTA) is conducted. Specifically, the substrate 200 is heated up to an elevated temperature between 950° C. and 1050° C. at a rate of 100° C. per second and then kept at the temperature for a short period of time between about 1 second. and about 10 seconds. In this manner, an n-type high-concentration dopant diffused layer 204 with a deep junction is formed in the source/drain regions of the semiconductor substrate 200 by diffusing the arsenic ions.

According to the second embodiment, the process step of implanting indium ions is performed by implanting the indium ions several times at a relatively low implant dose each (e.g., $1 \times 10^{13}/cm^2$ or less), which is obtained by dividing a predetermined implant dose. Accordingly, no amorphous layers will be created in the semiconductor substrate 200 and neither amorphous/crystalline interface nor dislocation loop layer (which is usually formed near the amorphous/crystalline interface) will be formed, either. As a result, it is possible to avoid a situation where dopant atoms are trapped and segregate in the dislocation loop layer. Since no dislocation loop layer is formed, leakage current decreases. Consequently, a semiconductor device can be fabricated using the heavy ions so as to have a shallower junction depth and a reduced junction leakage current.

Furthermore, every time the indium ions are implanted at the divided, low implant dose, the rapid thermal annealing process is conducted. Thus, the damage done on the crystals in the semiconductor substrate 200 through the indium ion implantation can be repaired each time. Accordingly, it is possible to avoid a situation where the implant damage accumulates every time the ions are implanted at the dose, obtained by dividing the predetermined dose, so that the semiconductor substrate 200 is amorphized unintentionally. Also, since the damage is repaired after every ion implantation process, the number of crystal imperfections themselves contained in the crystalline (i.e., non-amorphized) layer can also be reduced. Thus, the leakage current can be further reduced.

Moreover, the p-type dopant diffused layer 203 to be a channel region is formed by implanting indium ions with a large mass into the semiconductor substrate 200. Thus, the dopant concentration is relatively low in the uppermost part of the channel region that is closest to the surface of the substrate. Accordingly, the carrier mobility will not decrease in that part and yet a steep dopant concentration can be obtained in another part of the channel region that is slightly deeper than the substrate surface. As a result, the transistor can be downsized without decreasing the driving power thereof.

Furthermore, immediately after the ions of indium with a large mass have been implanted, the annealing process (RTA) is performed to form the p-type dopant diffused layer 203. Thus, the damage done on the crystals in the semiconductor substrate 200 as a result of the indium ion implantation can be repaired.

In the second embodiment, indium ions are implanted for the dopant diffused layer 203 to be a channel region. Alternatively, either boron ions or boron and indium ions may be implanted instead.

Also, indium ions are used as dopant ions for the pocket dopant diffused layer 206. Optionally, ions of another element, belonging to the same Group 3B as indium but having a mass number greater than that of indium, may also be used.

Furthermore, the third annealing process (i.e., the process step shown in FIG. 4(a)) may be omitted. In that case, by conducting the fourth annealing process (i.e., the process step shown in FIG. 4(c)), the n-type extended high-concentration dopant diffused layer 205 and high-concentration dopant diffused layer 204 can be formed at a time.

Moreover, the second embodiment is an n-channel MIS transistor. Alternatively, a p-channel MIS transistor is also implementable. In fabricating a p-channel MIS transistor, antimony ions are preferably implanted as dopant ions for the pocket dopant diffused layer 206.

EMBODIMENT 3

Hereinafter, a method for fabricating an MIS transistor according to a third embodiment of the present invention will be described with reference to FIGS. 5(a) through 5(d) and FIGS. 6(a) through 6(c).

Figure 5A:
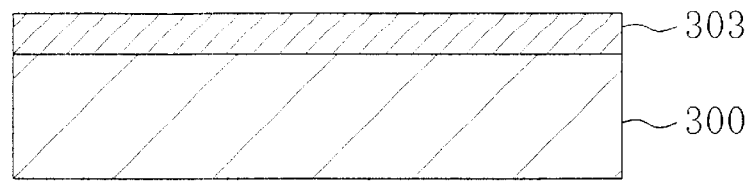
FIGS. 5(a) through 5(d) are cross-sectional views illustrating respective process steps for fabricating an MIS transistor according to a third embodiment of the present invention.

First, as shown in FIG. 5(a), ions of a p-type dopant (e.g., indium ions) are implanted into a semiconductor substrate 300 of p-type silicon at an implant energy of 200 keV and at an implant dose of about $1 \times 10^{12}/cm^2$. Just after this ion implantation, a first annealing process (i.e., RTA) is conducted. Specifically, the semiconductor substrate 300 is heated up to an elevated temperature between 950° C. and 1050° C. at a rate of 100° C. per second and then kept at the temperature for a short period of time between about 1 second and about 10 seconds. In this manner, a p-type dopant diffused layer 303, which will be a channel region, is formed in a surface region of the semiconductor substrate 300.

Figure 5B:
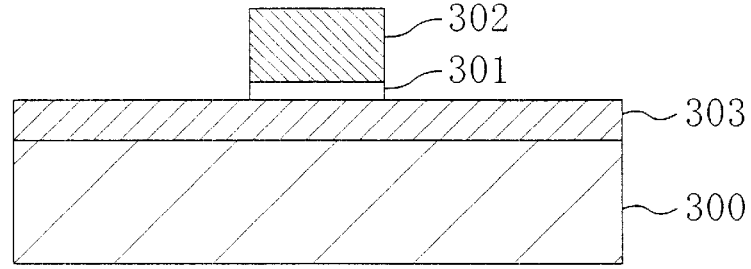

Next, as shown in FIG. 5(b), a gate electrode 302 (thickness: about 250 nm) of polysilicon film or poly-metal is formed over the semiconductor substrate 300 with a gate insulating film 301 (thickness: about 2.5 nm) interposed therebetween.

Figure 5C:
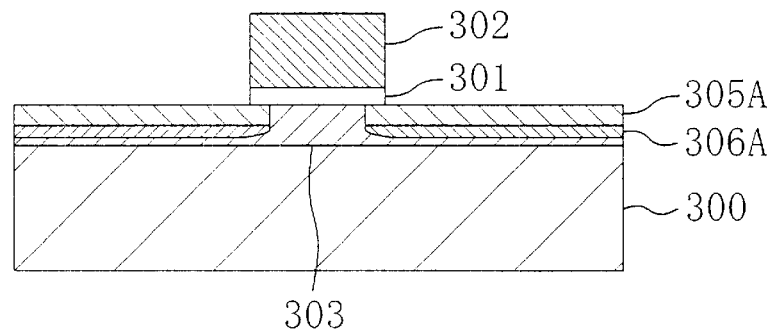

Subsequently, ions of a p-type dopant (e.g., indium ions) are implanted into the semiconductor substrate 300 at an implant energy of 15 keV and at an implant dose of about $1 \times 10^{14}/cm^2$ (i.e., $1 \times 10^{16}/cm^2$ or less) using the gate electrode 302 as a mask. In this manner, an amorphous layer is formed in the semiconductor substrate 300. Thereafter, ions of an n-type dopant (e.g., arsenic ions) are implanted into the semiconductor substrate 300 at an implant energy of 10 kev and at an implant dose of about $5 \times 10^4/cm^2$ using the gate electrode 302 as a mask. In this manner, as shown in FIG. 5(c), an n-type extended high-concentration dopant layer 305A with a shallow junction is formed in respective regions of the semiconductor substrate 300 to be source/drain regions by doping the arsenic ions thereto. In addition, a p-type pocket dopant layer 306A is also formed under the extended high-concentration dopant layer 405A by doping the indium ions.

Figure 5D:
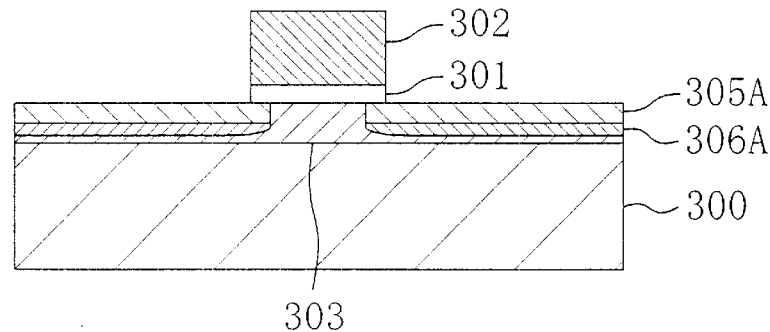
Figure 7:
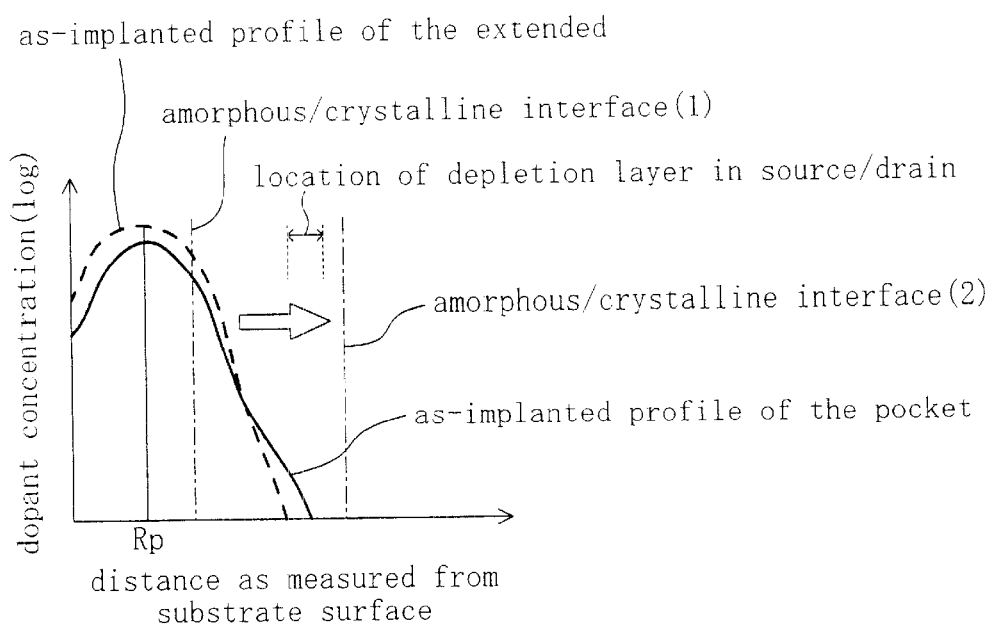
FIG. 7 is a graph illustrating how an amorphous/crystalline interface, existing in a semiconductor region, moves to a deeper level in the substrate in the third embodiment of the present invention.

Then, in the process step shown in FIG. 5(d), germanium ions are implanted at an implant energy of 150 keV and at an implant dose of about $1 \times 10^{16}/cm^2$. As a result, the amorphous layer, existing in the semiconductor substrate 300, is lowered to a deeper level in the substrate 300. Thus, as indicated by the open arrow in FIG. 7, the amorphous/crystalline interface moves from the amorphous/crystalline interfacial level (1) to the amorphous/crystalline interfacial level (2), i.e., moves downward into a deeper region of the substrate. The amorphous/crystalline interface is deepened inside the substrate down to the level (2), which will be even deeper than a depletion layer to be created near the junction between a high-concentration dopant diffused layer 304 that will be formed later and the substrate. Accordingly, even if a dislocation loop layer is formed below the amorphous/crystalline interface, the dislocation loop layer is located at such a level as not affecting the high-concentration dopant diffused layer 304 that will make the source/drain regions. Thus, the amount of the leakage current, flowing from the high-concentration dopant diffused layer 304 (to be the source/drain regions) into the substrate, will not increase.

Figure 6A:
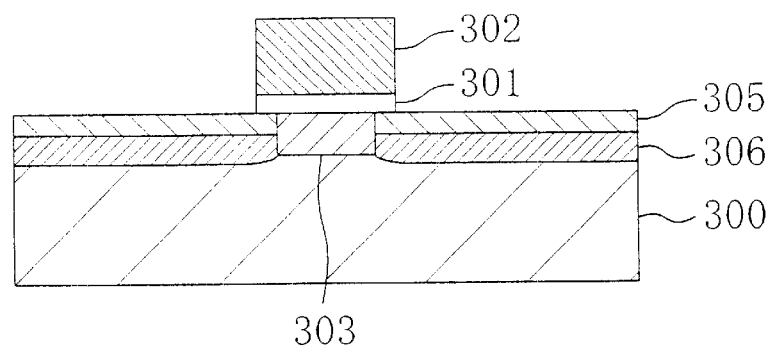
FIGS. 6(a) through 6(c) are cross-sectional views illustrating respective process steps for fabricating the MIS transistor of the third embodiment of the present invention.

Next, a second annealing process (RTA) is conducted. Specifically, the semiconductor substrate 300 is heated up to an elevated temperature between 950° C. and 1050° C. at a rate of 100° C. per second and then kept at the temperature for a short period of time between about 1 second and about 10 seconds. In this manner, an n-type extended high-concentration dopant diffused layer 305 with a shallow junction is formed in the source/drain regions of the semiconductor substrate 300 as shown in FIG. 6(a). In addition, a p-type pocket dopant diffused layer 306 is also formed under the extended high-concentration dopant diffused layer 305.

Figure 6B:
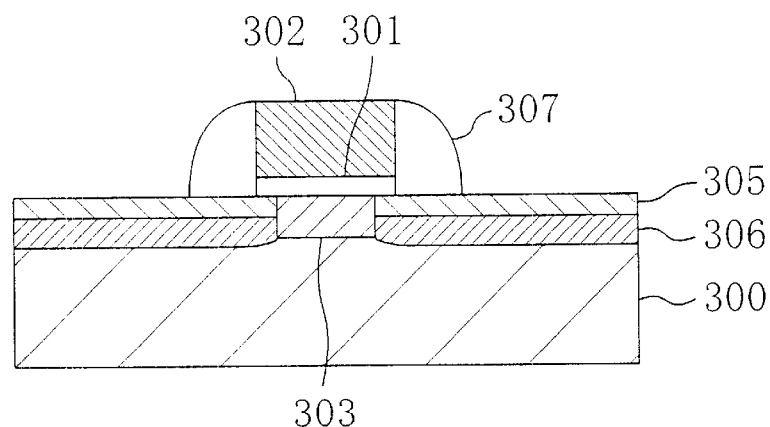
Figure 6C:
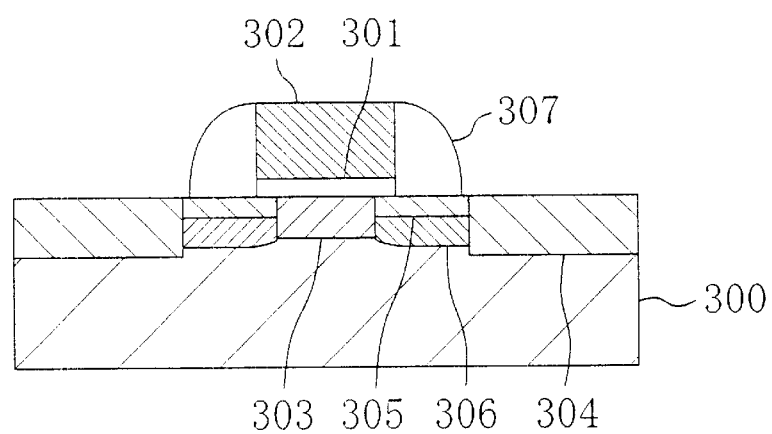

Then, a silicon nitride film is deposited to a thickness of 50 nm, for example, over the entire surface of the semiconductor substrate 300 and then etched anisotropically, thereby forming a sidewall 307 on the side faces of the gate electrode 302 as shown in FIG. 6(b). It should be noted that the sidewall 307 may be formed out of a silicon dioxide film, not the silicon nitride film.

Next, ions of an n-type dopant (e.g., arsenic ions) are implanted at an implant energy of 30 kev and at an implant dose of about $3 \times 10^{15}/cm^2$ using the gate electrode 302 and sidewall 307 as a mask. Subsequently, a third annealing process (i.e., RTA) is conducted. Specifically, the substrate 300 is heated up to an elevated temperature between 950° C. and 1050° C. at a rate of 100° C. per second and then kept at the temperature for a short period of time between about 1 second and about 10 seconds. In this manner, the n-type high-concentration dopant diffused layer 304 with a deep junction is formed in the source/drain regions of the semiconductor substrate 300.

According to the third embodiment, after the amorphous layer has been formed in the semiconductor substrate 300 by implanting indium ions at an implant dose of about $1 \times 10^{14}/cm^2$ to make the pocket dopant diffused layer 306, arsenic ions are implanted. Accordingly, channeling of the arsenic ions is avoidable. Also, according to the third embodiment, indium ions with a large mass number are used to form the pocket dopant diffused layer 306, thereby bringing about the additional effect of pre-amorphizing the semiconductor substrate 300 (i.e., pre-amorphization effect). Thus, there is no need to separately perform an implantation process for the very purposes of pre-amorphization.

Moreover, thanks to the pre-amorphization effect produced by the implantation of the heavy ions for forming the pocket dopant diffused layer 306, the extended high-concentration dopant layer 105A (or the extended high-concentration dopant diffused layer 105 eventually) can have a shallower junction.

An implant dose, at which the amorphous layer can be formed by implanting the indium ions, may be $5 \times 10^{13}/cm^2$ or more (and $1 \times 10^6/cm^2$ or less).

Furthermore, after the indium and arsenic ions have been implanted, the germanium ions are implanted to lower the amorphous layer, existing in the semiconductor substrate 300, to a deeper level in the substrate 300. And then the second annealing process (RTA) is conducted to form the extended high-concentration dopant diffused layer 305 and pocket dopant diffused layer 306. Thus, the annealing process can be performed after the amorphous/crystalline interface has moved to a level far away from a region that will affect the transistor electrically. For that reason, even if the rapid thermal annealing is carried out while the amorphous/crystalline interface exists, the dislocation loop layer will be formed at a level much distant from the vicinity of the junction. Accordingly, the leakage current is suppressible. Moreover, since the dislocation loop layer is located at a level far away from the high-concentration region of indium, it is also possible to suppress the indium ions from being segregated in the dislocation loop layer.

As the ions used for lowering the amorphous layer, existing in the semiconductor substrate 300, to a deeper level in the substrate 300, ions of a Group IV element (e.g., silicon ions) may also be used instead of germanium ions. In using silicon ions, the silicon ions are preferably implanted at an implant energy of 120 keV and at an implant dose of about $1 \times 10^{16}/cm^2$.

As can be seen, if ions of a Group IV element are implanted, then it is possible to avoid a situation where the semiconductor substrate 300 has its conductivity type inverted into n- or p-type and where the source/drain regions are affected because the dopant is electrically neutral.

Also, according to the third embodiment, the second annealing process, which is conducted to form the extended high-concentration dopant diffused layer 305 and pocket dopant diffused layer 306, is rapid thermal annealing. Thus, the arsenic and indium ions can be both activated to greater extents and the transient enhanced diffusion of the arsenic ions can be prevented. As a result, the extended high-concentration dopant diffused layer 305 can have a shallower junction.

Moreover, the p-type dopant diffused layer 303 to be a channel region is formed by implanting indium ions with a large mass into the semiconductor substrate 300. Thus, the dopant concentration is relatively low in the uppermost part of the channel region that is closest to the surface of the substrate. Accordingly, the carrier mobility will not decrease in that part and yet a steep dopant concentration can be obtained in another part of the channel region that is slightly deeper than the substrate surface. As a result, the transistor can be downsized without decreasing the driving power thereof.

Furthermore, immediately after the ions of indium with a large mass have been implanted, the annealing process (RTA) is performed to form the p-type dopant diffused layer 303. Thus, the damage done on the crystals in the semiconductor substrate 300 as a result of the indium ion implantation can be repaired.

In the third embodiment, indium ions are implanted for the p-type dopant diffused layer 303 to be a channel region. Alternatively, either boron ions or boron and indium ions may be implanted instead.

Also, indium ions are used as dopant ions for the pocket dopant diffused layer 306. optionally, ions of another element, belonging to the same Group 3B as indium but having a mass number greater than that of indium, may also be used.

Furthermore, the second annealing process (i.e., the process step shown in FIG. 6(a)) may be omitted. In that case, by conducting the third annealing process (i.e., the process step shown in FIG. 6(c)), the n-type extended high-concentration dopant diffused layer 305, p-type pocket dopant diffused layer 306 and high-concentration dopant diffused layer 304 can be formed at a time.

Moreover, the third embodiment is an n-channel MIS transistor. Alternatively, a p-channel MIS transistor is also implementable. In fabricating a p-channel MIS transistor, either antimony ions or ions of any other Group 5B element with a mass number greater than that of antimony may be implanted as dopant ions for the pocket dopant diffused layer 306.

EMBODIMENT 4

Hereinafter, a method for fabricating an MIS transistor according to a fourth embodiment of the present invention will be described with reference to FIGS. 8(a) through 8(c) and FIGS. 9(a) and 9(b).

Figure 8A:
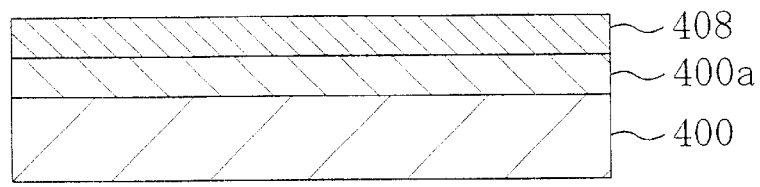
FIGS. 8(a) through 8(c) are cross-sectional views illustrating respective process steps for fabricating an MIS transistor according to a fourth embodiment of the present invention.

First, as shown in FIG. 8(a), ions of an n-type dopant (e.g., arsenic ions) are implanted into a p-type semiconductor substrate 400 at an implant energy of 130 keV and at an implant dose of about $1 \times 10^2/cm^2$. Next, phosphorus ions, for example, are implanted twice at an implant energy of 260 keV and at an implant dose of $4 \times 10^{12}/cm^2$ and then at an implant energy of 540 kev and at an implant dose of $1 \times 10^{13}/cm^2$ to form an n-well region 400a.

Just after these ion implantation processes, a first annealing process (i.e., RTA) is conducted. Specifically, the semiconductor substrate 400 is heated up to an elevated temperature between 950° C. and 1050° C. at a rate of 100° C. per second and then kept at the temperature for a short period of time between about 1 second and about 10 seconds. In this manner, an n-type dopant diffused layer 408, which will be a channel region, and the n-well region 400a are formed in respective surface regions of the semiconductor substrate 400.

Figure 8B:
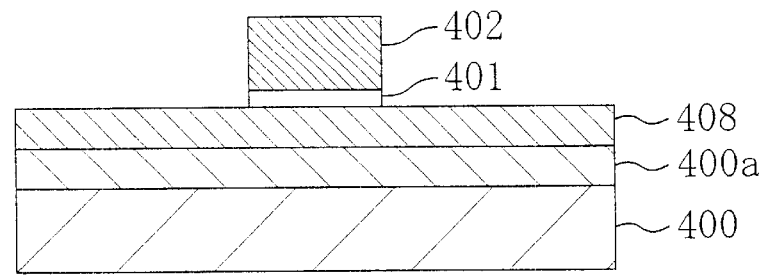

Next, as shown in FIG. 8(b), a gate electrode 402 (thickness: about 250 nm) of polysilicon film or poly-metal is formed over the semiconductor substrate 400 with a gate insulating film 401 (thickness: about 2.5 nm) interposed therebetween.

Figure 8C:
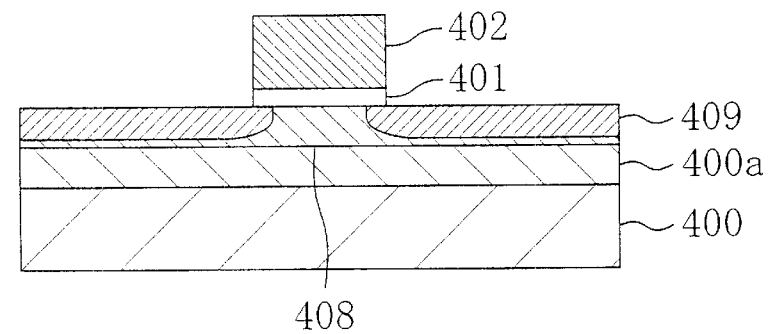

Subsequently, ions of a p-type dopant (e.g., indium ions) are implanted into the semiconductor substrate 400 at an implant energy of 5 keV and at an implant dose of about $1 \times 10^{13}/cm^2$ using the gate electrode 402 as a mask. Thereafter, a second annealing process (i.e., RTA) is conducted. Specifically, the substrate 400 is heated up to an elevated temperature between 950° C. and 1050° C. at a rate of 100° C. per second and then kept at the temperature for a short period of time between about 1 second and about 10 seconds. By repeatedly performing these ion implantation and annealing process steps twenty times in total, for example, a p-type extended high-concentration dopant diffused layer 409 with a shallow junction is formed in the surface regions (i.e., source/drain regions) of the semiconductor substrate 400 through diffusion of the indium ions as shown in FIG. 8(c).

It should be noted that the number of times the ion implantation and annealing process steps are repeated does not have to be twenty. However, to attain a predetermined dopant concentration in the end, the indium ions should be implanted several times at a divided implant dose, which is low enough to prevent any amorphous layer from being created through the indium ion implantation. Also, just after the ions have been implanted each time, the annealing should be conducted at an elevated temperature for a short period of time. It should be noted that the annealing processes to be conducted multiple times (e.g., twenty times in total) are herein collectively called the "second annealing process" for convenience sake.

Figure 9A:
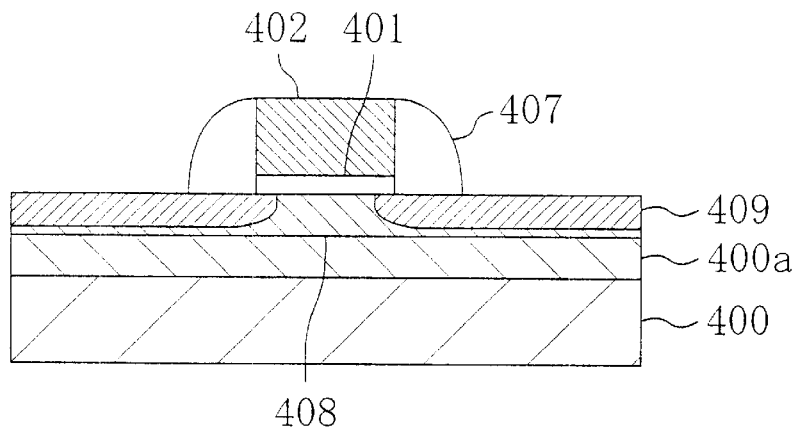
FIGS. 9(a) and 9(b) are cross-sectional views illustrating respective process steps for fabricating the MIS transistor of the fourth embodiment of the present invention.

Then, a silicon nitride film is deposited to a thickness of 50 nm, for example, over the entire surface of the semiconductor substrate 400 and then etched anisotropically, thereby forming a sidewall 407 on the side faces of the gate electrode 402 as shown in FIG. 9(a). It should be noted that the sidewall 407 may be formed out of a silicon dioxide film, not the silicon nitride film.

Figure 9B:
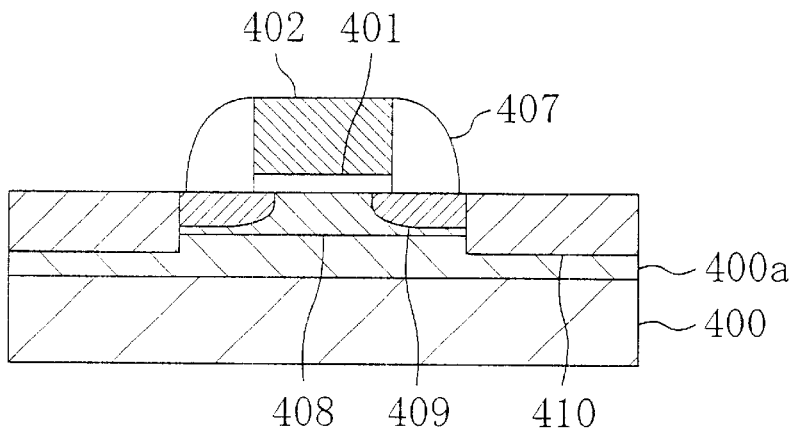
Figure 10:
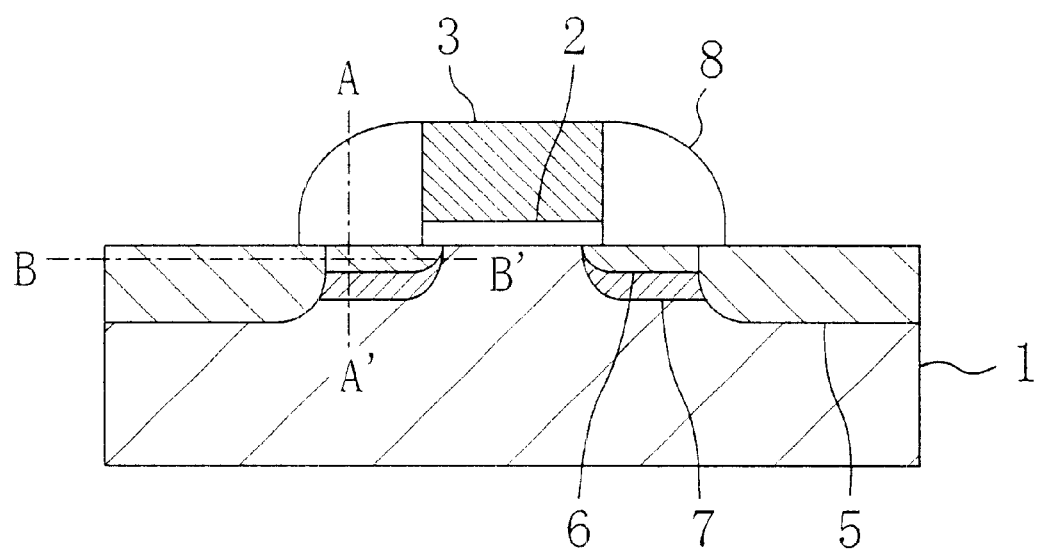
FIG. 10 is a cross-sectional view of a known MIS transistor.
Figure 11A:
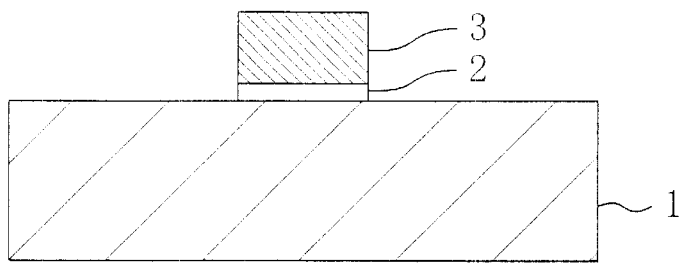
Figure 11B:
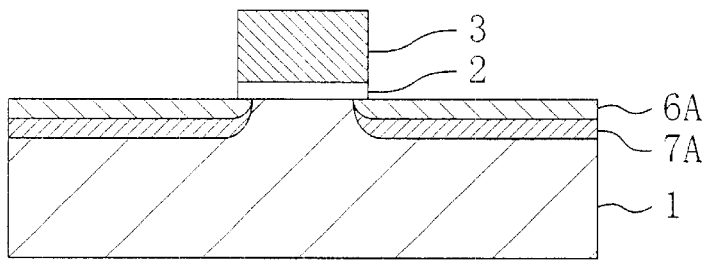
Figure 11C:
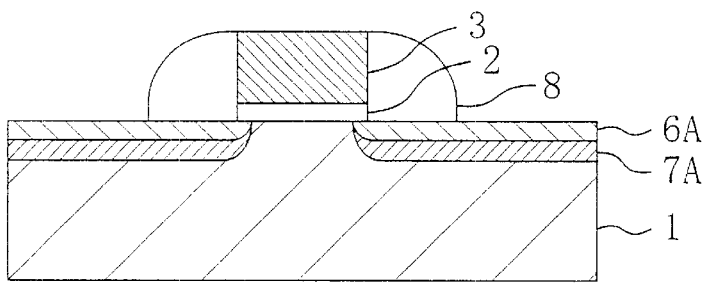
Figure 11D:
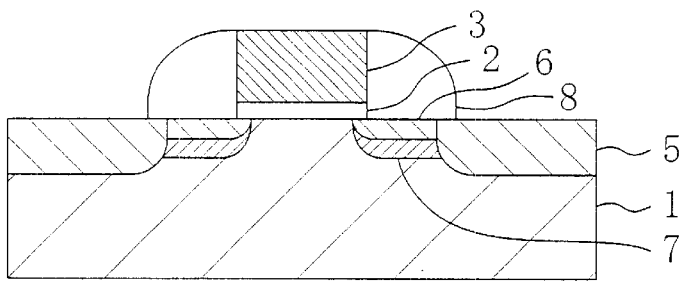
Figure 11E:
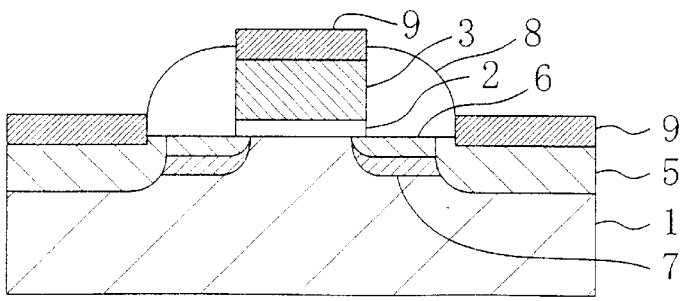
Figure 12:
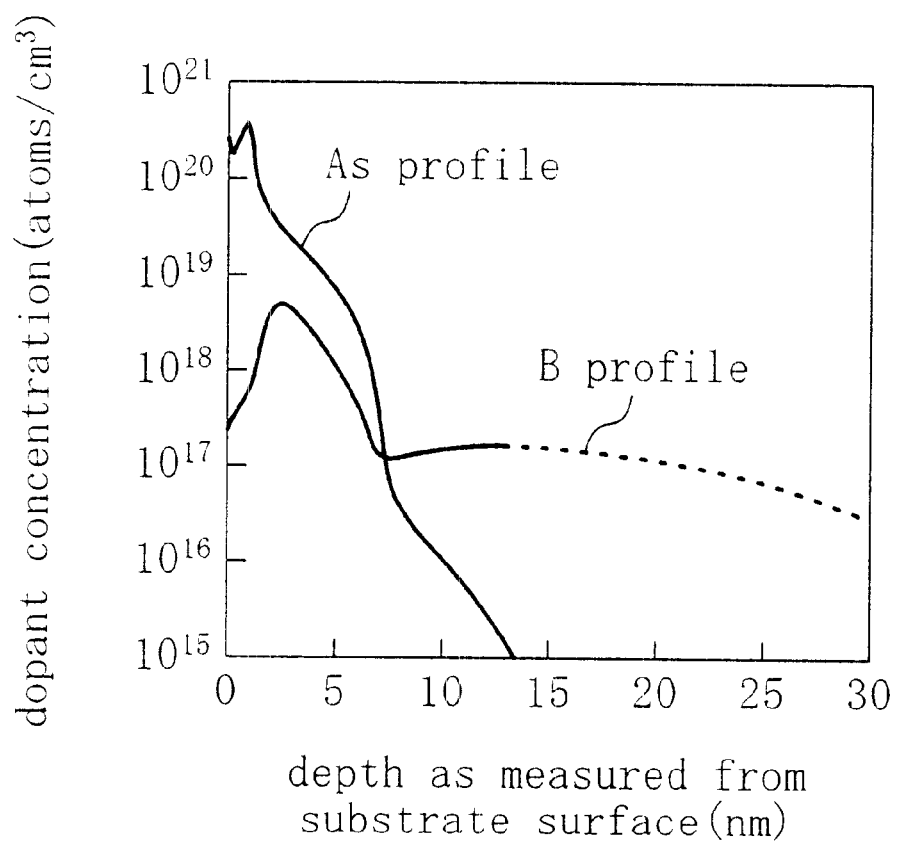
FIG. 12 is a graph illustrating a relationship between the depth as measured from the surface of the substrate and the dopant concentrations for the known MIS transistor.

Next, ions of a p-type dopant (e.g., boron ions) are implanted at an implant energy of 5 keV and at an implant dose of about $3 \times 10^5/cm^2$ using the gate electrode 402 and sidewall 407 as a mask. Thereafter, a third annealing process (i.e., RTA) is conducted. Specifically, the substrate 400 is heated up to an elevated temperature between 950° C. and 1050° C. at a rate of 100° C. per second and then kept at the temperature for a short period of time between about 1 second and about 10 seconds. In this manner, a p-type high-concentration dopant diffused layer 410 with a deep junction is formed in the source/drain regions of the semiconductor substrate 400 as shown in FIG. 9(b).

According to the fourth embodiment, the process step of implanting indium ions is performed by implanting the indium ions several times at a relatively low implant dose each (e.g., $1 \times 10^{13}/cm^2$ or less), which is obtained by dividing a predetermined implant dose. Accordingly, no amorphous layers will be created in the semiconductor substrate 400, and no amorphous/crystalline interface is formed in the extended high-concentration dopant layer 409A. That is to say, even if the indium ions are implanted at a dose greater than $5 \times 10^{13}/cm^2$, no dislocation loop layer will be formed near the amorphous/crystalline interface. Accordingly, it is possible to avoid a situation where dopant atoms are trapped and segregate in the dislocation loop layer. In this manner, the extended high-concentration dopant diffused layer 409 of indium can be formed.

Also, since no dislocation loop layer is formed, leakage current decreases. Consequently, a semiconductor device can be fabricated using the heavy ions so as to have a shallower junction depth and a reduced junction leakage current.

Furthermore, every time the indium ions are implanted at the divided, low implant dose, the rapid thermal annealing process is conducted. Thus, the damage done on the crystals in the semiconductor substrate 400 through the indium ion implantation can be repaired each time. Accordingly, it is possible to avoid a situation where the implant damage accumulates every time the ions are implanted at the dose, obtained by dividing the predetermined dose, so that the semiconductor substrate 400 is amorphized unintentionally. Also, since the damage is repaired after every ion implantation process, the number of crystal imperfections themselves contained in the crystalline (i.e., non-amorphized) layer can also be reduced. Thus, the leakage current can be further reduced.

In the fourth embodiment, arsenic ions are implanted for the n-type dopant diffused layer 403 to be a channel region. Alternatively, antimony ions may be implanted instead.

Also, indium is used to form the extended high-concentration dopant diffused layer 409. Optionally, ions of another element, belonging to the same Group 3B as indium but having a mass number greater than that of indium, may also be used.

Moreover, the fourth embodiment is a p-channel MIS transistor. Alternatively, an n-channel MIS transistor is also implementable. In fabricating an n-channel MIS transistor, either antimony ions or ions of any other Group 5B element with a mass number greater than that of antimony may be implanted as dopant ions for the extended high-concentration dopant diffused layer 409.

What is claimed is:

1. A method for fabricating a semiconductor device, comprising the steps of:

a) forming a gate electrode over a semiconductor region with a gate insulating film interposed therebetween;

b) forming an amorphous layer in the semiconductor region by implanting heavy ions with a large mass into the semiconductor region using the gate electrode as a mask;

c) after the step b), implanting ions of a first dopant into the semiconductor region using the gate electrode as a mask;

d) after the step c), conducting a first annealing process on the semiconductor region at a temperature between 400° C. and 550° C., thereby making the amorphous layer recover into a crystalline layer; and e) after the step d), conducting a second annealing process on the semiconductor region with a temperature higher than the temperature of the first annealing process, thereby forming an extended high-concentration dopant diffused layer of a first conductivity type and a pocket dopant diffused layer of a second conductivity type, the extended high-concentration dopant diffused layer being formed to have a shallow junction by diffusing the first dopant, the pocket dopant diffused layer being formed under the extended high-concentration dopant diffused layer by diffusing the heavy ions.

2. A method for fabricating a semiconductor device according to claim 1, further comprising the steps of:
f) after the step e), forming a sidewall on side faces of the gate electrode and then implanting ions of a second dopant into the semiconductor region using the gate electrode and the sidewall as a mask; and
g) activating and diffusing the second dopant, thereby forming a high-concentration dopant diffused layer of the first conductivity type, which is located outside of the extended high-concentration dopant diffused layer and has a deep junction.

3. A method for fabricating a semiconductor device according to claim 1, wherein an implant dose of the heavy ions is $5 \times 10^{13}/cm^2$ or more.

4. A method for fabricating a semiconductor device according to claim 1, wherein the second annealing process is a rapid thermal annealing process in which the semiconductor region is heated up to a temperature between 950° C. and 1050° C. at a rate of 100° C. per second or more and then kept at the temperature for a period of time between 1 second and 10 seconds.

5. A method for fabricating a semiconductor device, comprising the steps of:
a) forming a gate electrode over a semiconductor region with a gate insulating film interposed therebetween;
b) repeatedly performing, a number of times, the steps of
first, implanting, using the gate electrode as a mask, heavy ions with a large mass into the semiconductor region at such an implant dose as forming no amorphous layers and
second, after the first step, conducting a first annealing process on the semiconductor region at an elevated temperature for a short period of time;
c) after the step b), implanting ions of a first dopant into the semiconductor region using the gate electrode as a mask; and
d) after the step c), conducting a second annealing process on the semiconductor region, thereby forming an extended high-concentration dopant diffused layer of a first conductivity type and a pocket dopant diffused layer of a second conductivity type, the extended high-concentration dopant diffused layer being formed to have a shallow junction by diffusing the first dopant, the pocket dopant diffused layer being formed under the extended high-concentration dopant diffused layer by diffusing the heavy ions.

6. A method for fabricating a semiconductor device according to claim 5, further comprising the steps of:
e) after the step d), forming a sidewall on side faces of the gate electrode and then implanting ions of a second dopant into the semiconductor region using the gate electrode and the sidewall as a mask; and
f) activating and diffusing the second dopant, thereby forming a high-concentration dopant diffused layer of the first conductivity type, which is located outside of the extended high-concentration dopant diffused layer and has a deep junction.

7. A method for fabricating a semiconductor device according to claim 5, wherein an implant dose of the heavy ions is $5 \times 10^{13}/cm^2$ or less.

8. A method for fabricating a semiconductor device according to claim 5, wherein the second annealing process is a rapid thermal annealing process in which the semiconductor region is heated up to a temperature between 950° C. and 1050° C. at a rate of 100° C. per second or more and then kept at the temperature for a period of time between 1 second and 10 seconds.

9. A method for fabricating a semiconductor device, comprising the steps of:
a) forming a gate electrode over a semiconductor region with a gate insulating film interposed therebetween;
b) forming an amorphous layer in the semiconductor region by implanting heavy ions with a large mass into the semiconductor region using the gate electrode as a mask;
c) after the step b), implanting ions of a first dopant into the semiconductor region using the gate electrode as a mask;
d) after the step c), implanting ions of a Group IV element into the semiconductor region using the gate electrode as a mask, thereby lowering the amorphous layer to a deeper level in a substrate; and
e) after the step d), conducting an annealing process on the semiconductor region, thereby forming an extended high-concentration dopant diffused layer of a first conductivity type and a pocket dopant diffused layer of a second conductivity type, the extended high-concentration dopant diffused layer being formed to have a shallow junction by diffusing the first dopant, the pocket dopant diffused layer being formed under the extended high-concentration dopant diffused layer by diffusing the heavy ions.

10. A method for fabricating a semiconductor device according to claim 9, further comprising the steps of:
f) after the step e), forming a sidewall on side faces of the gate electrode and then implanting ions of a second dopant into the semiconductor region using the gate electrode and the sidewall as a mask; and
g) activating and diffusing the second dopant, thereby forming a high-concentration dopant diffused layer of the first conductivity type, which is located outside of the extended high-concentration dopant diffused layer and has a deep junction.

11. A method for fabricating a semiconductor device according to claim 9, wherein an implant dose of the heavy ions is $5 \times 10^{13}/cm^2$ or more.

12. A method for fabricating a semiconductor device according to claim 9, wherein the annealing process is a rapid thermal annealing process in which the semiconductor region is heated up to a temperature between 950° C. and 1050° C. at a rate of 100° C. per second or more and then kept at the temperature for a period of time between 1 second and 10 seconds.

13. A method for fabricating a semiconductor device, comprising the steps of:
a) forming a gate electrode over a semiconductor region with a gate insulating film interposed therebetween;
b) forming an extended high-concentration dopant diffused layer of a first conductivity type through diffusion of heavy ions with a large mass by repeatedly performing, a number of times, the steps of
first, implanting, using the gate electrode as a mask, the heavy ions into the semiconductor region at such an implant dose as forming no amorphous layers and second after the first step, conducting an annealing process on the semiconductor region at an elevated temperature for a short period of time;

c) after the step b), forming a sidewall on side faces of the gate electrode and then implanting ions of a dopant into the semiconductor region using the gate electrode and the sidewall as a mask; and d) activating and diffusing the dopant, thereby forming a high-concentration dopant diffused layer of the first conductivity type, which is located outside of the extended high-concentration dopant diffused layer and has a deep junction.

14. A method for fabricating a semiconductor device according to claim 13, wherein an implant dose of the heavy ions is $5 \times 10^{13}/cm^2$ or less.

15. A method for fabricating a semiconductor device according to claim 13, wherein the annealing process is a rapid thermal annealing process in which the semiconductor region is heated up to a temperature between 950° C. and 1050° C. at a rate of 100° C. per second or more and then kept at the temperature for a period of time between 1 second and 10 seconds.

16. A method for fabricating a semiconductor device according to claim 1, wherein the heavy ions are indium or antimony.

17. A method for fabricating a semiconductor device according to claim 5, wherein the heavy ions are indium or antimony.

18. A method for fabricating a semiconductor device according to claim 9, wherein the heavy ions are indium or antimony.

19. A method for fabricating a semiconductor device according to claim 13, wherein the heavy ions are indium or antimony.

* * * * *

UNITED STATES PATENT AND TRADEMARK OFFICE
CERTIFICATE OF CORRECTION

PATENT NO. : 6,432,802 B1
DATED : August 13, 2002
INVENTOR(S) : Taiji Noda et al.

It is certified that error appears in the above-identified patent and that said Letters Patent is hereby corrected as shown below:

<u>Title page,</u>
Item [73], Assignee, delete "Matsushita Electronics Corporation" and add
-- Matsushita Electric Industrial Co., Ltd. --

Signed and Sealed this

Eighth Day of June, 2004

JON W. DUDAS
*Acting Director of the United States Patent and Trademark Office*